United States Patent
Harada et al.

(10) Patent No.: US 10,741,683 B2
(45) Date of Patent: *Aug. 11, 2020

(54) SEMICONDUCTOR DEVICE AND METHOD FOR MANUFACTURING SAME

(71) Applicant: Sumitomo Electric Industries, Ltd., Osaka-shi (JP)

(72) Inventors: Shin Harada, Osaka (JP); Makoto Sasaki, Itami (JP); Taro Nishiguchi, Itami (JP); Kyoko Okita, Itami (JP); Keiji Wada, Osaka (JP); Tomihito Miyazaki, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/918,652

(22) Filed: Mar. 12, 2018

(65) Prior Publication Data

US 2018/0204942 A1 Jul. 19, 2018

Related U.S. Application Data

(63) Continuation of application No. 13/634,860, filed as application No. PCT/JP2010/072871 on Dec. 20, 2010, now Pat. No. 9,947,782.

(30) Foreign Application Priority Data

Mar. 23, 2010 (JP) .................. 2010-066197

(51) Int. Cl.
*H01L 29/78* (2006.01)
*H01L 21/02* (2006.01)
(Continued)

(52) U.S. Cl.
CPC .... *H01L 29/7802* (2013.01); *H01L 21/02002* (2013.01); *H01L 21/02008* (2013.01);
(Continued)

(58) Field of Classification Search
None
See application file for complete search history.

(56) References Cited

U.S. PATENT DOCUMENTS 6,734,461 B1 5/2004 Shiomi et al.
2003/0227061 A1 12/2003 Yokogawa et al.
(Continued)

FOREIGN PATENT DOCUMENTS

EP 1 215 730 A1 6/2002
JP H07-97299 A 4/1995
(Continued)

OTHER PUBLICATIONS

Irmsher et al., "Stacking faults in heavily nitrogen doped 4H-SiC," The European Physical Journal Applied Physics, vol. 27, pp. 243-246 (2004). [Cited in Parent].
(Continued)

*Primary Examiner* — Davienne N Monbleau
*Assistant Examiner* — Scott R Wilson
(74) *Attorney, Agent, or Firm* — Baker Botts L.L.P.; Michael A. Sartori

(57) ABSTRACT

A semiconductor device has a semiconductor layer and a substrate. The semiconductor layer constitutes at least a part of a current path, and is made of silicon carbide. The substrate has a first surface supporting the semiconductor layer, and a second surface opposite to the first surface. Further, the substrate is made of silicon carbide having a 4H type single-crystal structure. Further, the substrate has a physical property in which a ratio of a peak strength in a wavelength of around 500 nm to a peak strength in a
(Continued)

wavelength of around 390 nm is 0.1 or smaller in photoluminescence measurement. In this way, the semiconductor device is obtained to have a low on-resistance.

12 Claims, 9 Drawing Sheets

(51) Int. Cl.
    *H01L 21/20*     (2006.01)
    *H01L 29/04*     (2006.01)
    *H01L 29/66*     (2006.01)
    *H01L 29/739*     (2006.01)
    *H01L 29/16*     (2006.01)

(52) U.S. Cl.
    CPC ........ *H01L 21/2007* (2013.01); *H01L 29/045* (2013.01); *H01L 29/66068* (2013.01); *H01L 29/66333* (2013.01); *H01L 29/7395* (2013.01); *H01L 29/1608* (2013.01)

(56) References Cited

U.S. PATENT DOCUMENTS

| | | |
|---|---|---|
| 2005/0181536 A1 | 8/2005 | Tsuji |
| 2007/0290211 A1 | 12/2007 | Nakayama et al. |
| 2009/0134405 A1 | 5/2009 | Ota et al. |
| 2009/0209090 A1 | 8/2009 | Yokoyama et al. |
| 2009/0250705 A1 | 10/2009 | Watanabe et al. |
| 2010/0075474 A1 | 3/2010 | Kudou et al. |
| 2011/0031505 A1 | 2/2011 | Harada et al. |
| 2011/0186862 A1 | 8/2011 | Harada et al. |

FOREIGN PATENT DOCUMENTS

| | | |
|---|---|---|
| JP | 10-308510 A | 11/1998 |
| JP | 2001-002499 A | 1/2001 |
| JP | 2003-068592 | 3/2003 |
| JP | 2005-286038 A | 10/2005 |
| JP | 2008-515749 | 5/2008 |
| JP | 2009-130266 A | 6/2009 |
| JP | 2009-158933 A | 7/2009 |
| JP | 2009-164571 A | 7/2009 |
| JP | 2009-256159 | 11/2009 |
| TW | 565630 B | 12/2003 |
| WO | 01/18872 A1 | 3/2001 |
| WO | 2005/099388 A2 | 10/2005 |
| WO | 2006/041660 A2 | 4/2006 |

OTHER PUBLICATIONS

Extended European Search Report in European Patent Application No. 10848496.5 dated Jun. 2, 2014. [Cited in Parent].
Feng et al., "Characterization of stacking faults in 4H-SiC epilayers by room-temperature microphotoluminescence mapping," Applied Physics Letters, vol. 92, pp. 221906-1-221906-3 (2008). [Cited in Parent].
Caldwell et al., "Influence of Temperature on Shockley Stacking Fault Expansion and Contraction in SiC PiN Diodes," Journal of Electronic Materials, vol. 37, No. 5, pp. 699-705 (2007). [Cited in Parent].
Notification of First Office Action in Chinese Patent Application No. 201080065662.7, dated Sep. 15, 2014. [Cited in Parent].
Notice of Grounds of Rejection in Japanese Patent Application No. 2015-084835, dated Jul. 5, 2016. [Cited in Parent].

SEMICONDUCTOR DEVICE AND METHOD FOR MANUFACTURING SAME

CROSS-REFERENCE TO RELATED APPLICATIONS

This application is a Continuation of U.S. patent application Ser. No. 13/634,860, filed Sep. 13, 2012, which is a 371 application of International application Ser. No. PCT/JP2010/072871, filed Dec. 20, 2010, which claims the benefit of Japanese Patent Application No. 2010-066197, filed Mar. 23, 2010.

TECHNICAL FIELD

The present invention relates to a semiconductor device and a method for manufacturing the semiconductor device, in particular, a semiconductor device having a substrate made of silicon carbide having a single-crystal structure, as well as a method for manufacturing such a semiconductor device.

BACKGROUND ART

Japanese Patent Laying-Open No. 10-308510 (Patent Literature 1) discloses a semiconductor device having a substrate made of single-crystal silicon carbide. According to this publication, in order to manufacture this device, a silicon carbide epitaxial layer is formed on a main surface of a semiconductor substrate made of single-crystal silicon carbide, a surface channel layer is disposed on the silicon carbide epitaxial layer, and a gate electrode is formed over a surface of the surface channel layer with a gate insulating film interposed therebetween. As a method for forming such a gate insulating film, an oxidation step involving heating is illustrated.

CITATION LIST

Patent Literature

PTL 1: Japanese Patent Laying-Open No. 10-308510

SUMMARY OF INVENTION

Technical Problem

The present inventors has found that the resistivity of the substrate may be greatly increased in the above-described process of manufacturing the semiconductor device. As the resistivity of the substrate is increased, the on-resistance of the semiconductor device is increased in the case where this substrate constitutes at least a part of a current path in the semiconductor device.

The present invention has been made to solve the foregoing problem and has its object to provide a semiconductor device that includes a substrate made of silicon carbide having a single-crystal structure and that has a low on-resistance, as well as a method for manufacturing such a semiconductor device.

Solution to Problem

A semiconductor device of the present invention is a semiconductor device having a current path, and includes a semiconductor layer and a substrate. The semiconductor layer constitutes at least a part of the current path and made of silicon carbide. The substrate has a first surface supporting the semiconductor layer and a second surface opposite to the first surface. The substrate is made of silicon carbide having a 4H type single-crystal structure. Moreover, the substrate has a physical property in which a ratio of a peak strength in a wavelength of around 500 nm to a peak strength in a wavelength of around 390 nm is 0.1 or smaller in photoluminescence measurement. Here, the limitation "the ratio is 0.1 or smaller" does not exclude a case where the ratio is 0.

The present inventors have found that one of causes of increase of the resistivity of a single-crystal substrate made of silicon carbide having a 4H type single-crystal structure is extension of faults specified by the existence of the peak in a wavelength of around 500 nm in the photoluminescence measurement. The semiconductor device of the present invention is based on this finding, and employs a substrate having less faults specified as described above, thereby suppressing the increase of the resistivity of the substrate. As a result, the on-resistance of the semiconductor device becomes low.

Preferably, the substrate has the physical property at the second surface. Accordingly, the faults can be prevented from being extended from the second surface of the substrate into the inside thereof.

Preferably, the semiconductor device further includes an insulating film on the semiconductor layer. In this way, a region electrically insulated from the semiconductor layer can be provided.

Preferably, the insulating film is made of an oxide of the material of the semiconductor layer. Accordingly, the insulating film can be formed using the semiconductor layer.

Preferably, the insulating film is a thermal oxidation film. Accordingly, the insulating film can be formed through a heating step. Further, according to the present invention, the resistivity of the substrate is prevented from being increased in this heating step.

Preferably, the substrate constitutes a part of the current path. Thus, the substrate having its resistivity suppressed from being increased constitutes a part of the current path, thereby achieving small on-resistance of the semiconductor device.

Preferably, the first surface has an off angle of not less than 50° and not more than 65° relative to a {0001} plane. This allows for higher channel mobility in the semiconductor device.

The off angle may have an off orientation falling within a range of ±5° or smaller relative to a <11-20> direction. This allows for higher channel mobility in the semiconductor device.

Alternatively, the off angle may have an off orientation falling within a range of ±5° or smaller relative to a <01-10> direction. In this case, preferably, the first surface has an off angle of not less than −3° and not more than +5° relative to a {03-38} plane in the <01-10> direction. More preferably, the first surface has an off angle of not less than −3° and not more than +5° relative to a (0-33-8) plane in the <01-10> direction. This allows for higher channel mobility in the semiconductor device. Here, the (0001) plane of single-crystal silicon carbide of hexagonal crystal is defined as the silicon plane whereas the (000-1) plane is defined as the carbon plane. Further, the "off angle relative to the {03-38} plane in the <01-10> direction" refers to an angle formed by an orthogonal projection of a normal line of the first surface to a flat plane defined by the <01-10> direction and the <0001> direction, and a normal line of the {03-38} plane. The sign of positive value corresponds to a case where the orthogonal projection approaches in parallel with the <01-10> direction whereas the sign of negative value corresponds to a case where the orthogonal projection approaches in parallel with the <0001> direction. Meanwhile, the "off angle relative to the (0-33-8) plane in the <01-10> direction" refers to an angle formed by the orthogonal projection of a normal line of the first surface to a flat plane defined by the <01-10> direction and the <0001> direction, and a normal line of the (0-33-8) plane. The sign of a positive value corresponds to a case where the orthogonal projection approaches in parallel with the <01-10> direction, whereas the sign of a negative value corresponds to a case where the orthogonal projection approaches in parallel with the <0001> direction. Further, the expression "the first surface having an off angle of not less than −3° and not more than +5° relative to the (0-33-8) plane in the <01-10> direction" indicates that the first surface corresponds to a plane, at the carbon plane side, which satisfies the above-described conditions in the silicon carbide crystal. Further, the (0-33-8) plane includes an equivalent plane, at the carbon plane side, which is expressed in a different manner due to determination of an axis for defining a crystal plane, and does not include a plane at the silicon plane side. Meanwhile, the {03-38} plane includes both the (0-33-8) plane, which is a plane at the carbon plane side, and a (03-38) plane, which is a plane at the silicon plane side.

Further, in the semiconductor device having the semiconductor layer epitaxially formed on the first surface close to the {03-38} plane and an insulating film (for example, gate oxide film) formed on the surface of the semiconductor layer, carrier mobility is improved in the semiconductor layer in the vicinity of an interface between the semiconductor layer and the insulating film. Further, the carrier mobility is further improved when the first surface of the substrate corresponds to a plane close to the (0-33-8) plane, which is a plane at the carbon plane side in the {03-38} plane.

Preferably, the semiconductor device further includes a base layer supporting the substrate and made of silicon carbide. The substrate can be supported by this base layer.

A method for manufacturing a semiconductor device in the present invention is a method for manufacturing a semiconductor device having a current path, and includes the following steps. A substrate is prepared which has a first surface and a second surface opposite to the first surface and which is made of silicon carbide having a 4H type single-crystal structure. A processing damage layer is formed on the second surface in the step of preparing the substrate. Thereafter, the processing damage layer on the second surface is removed. A semiconductor layer constituting at least a part of the current path and made of silicon carbide is formed on the first surface. The substrate and the semiconductor layer are heated after the step of removing the processing damage layer.

The present inventors have found that one of causes of increase of the resistivity of a single-crystal substrate made of silicon carbide having a 4H type single-crystal structure is extension of faults at a high temperature from the processing damage layer on the second surface of the substrate opposite to the first surface thereof on which the semiconductor layer is formed. The method for manufacturing the semiconductor device in the present invention is based on this finding, and provides suppression of extension of the above-described faults by removing the processing damage layer on the second surface. In this way, the resistivity of the substrate is suppressed from being increased, thereby achieving low on-resistance of the semiconductor device.

Preferably, the step of heating the substrate and the semiconductor layer includes the step of forming an insulating film on the semiconductor layer by thermally oxidizing a surface of the semiconductor layer. Accordingly, the insulating film can be formed on the semiconductor layer by means of the thermal oxidation of the semiconductor layer.

Preferably, the step of preparing the substrate includes the following steps. An ingot made of silicon carbide having a 4H type single-crystal structure is prepared. The second surface is formed by slicing the ingot.

Preferably, the first surface of the substrate is polished before the step of forming the semiconductor layer. Accordingly, the semiconductor layer can be formed on such a more smooth surface.

Preferably, a base layer made of silicon carbide is formed on the second surface of the substrate after the step of removing the processing damage layer and before the step of forming the semiconductor layer. The substrate can be supported by this base layer.

As the step of removing the processing damage layer, for example, at least one of the following methods can be employed: a method employing fused KOH etching; a method employing dry etching; a method employing sublimation of the processing damage layer; and a method employing polishing.

Advantageous Effects of Invention

As apparent from the description above, according to the present invention, there can be provided a semiconductor device that includes a substrate made of silicon carbide having a single-crystal structure and that has a low on-resistance, as well as a method for manufacturing such a semiconductor device.

DESCRIPTION OF EMBODIMENTS

Figure 1:
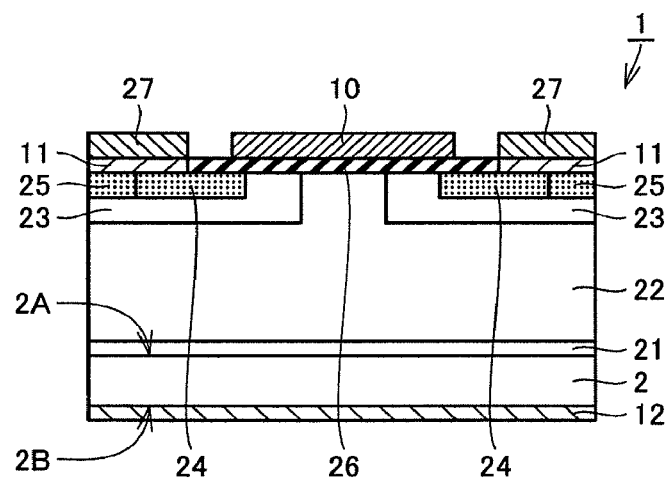
FIG. 1 is a cross sectional view schematically showing a configuration of a semiconductor device of a first embodiment.

The following describes embodiments of the present invention with reference to figures. It should be noted that in the below-mentioned figures, the same or corresponding portions are given the same reference characters and are not described repeatedly.

First Embodiment

Referring to FIG. 1, a semiconductor device 1 in the present embodiment has a current path in the longitudinal direction thereof, and is specifically a vertical type DiMOS-FET (Double Implanted MOSFET). Semiconductor device 1 includes a substrate 2, a buffer layer 21, a breakdown voltage holding layer 22, p regions 23, $n^+$ regions 24, $p^+$ regions 25, an oxide film 26, source electrodes 11, upper source electrodes 27, a gate electrode 10, and a drain electrode 12 formed on the backside surface of substrate 2. Buffer layer 21, breakdown voltage holding layer 22, p regions 23, $n^+$ regions 24, and $p^+$ regions 25 constitute a semiconductor layer disposed on substrate 2 and made of silicon carbide. This semiconductor layer constitutes a current path in semiconductor device 1 between each upper source electrode 27 and drain electrode 12.

Substrate 2 is made of silicon carbide (SiC) having a 4H type single-crystal structure, and has n type conductivity by containing an n type impurity (impurity providing substrate 2 with n type conductivity, such as nitrogen). Further, substrate 2 has a main surface 2A (first surface) and a backside surface 2B (second surface) opposite to this main surface 2A.

Further, substrate 2 has a physical property in which a ratio of a peak strength in a wavelength of around 500 nm to a peak strength in a wavelength of around 390 nm is 0.1 or smaller in photoluminescence measurement, preferably has a physical property in which this ratio is 0.01 or smaller, further preferably has a physical property in which this ratio is substantially 0. In this photoluminescence measurement, excitation laser (He—Cd laser) having a wavelength of 325 nm is used as excitation light, and a diffraction grating type spectrometer having a wavelength resolution of 1 nm is used as a measuring device. Specifically, in the photoluminescence measurement, drain electrode 12 is first removed to expose backside surface 2B. Next, backside surface 2B is irradiated with the laser light converged by a lens. Accordingly, photoluminescence light is generated from backside surface 2B, and enters the spectrometer via, if appropriate or necessary, a filter or the like. The spectrometer disperses the wavelength of the light, which is then detected by a CCD or the like. Accordingly, a spectrum of the photoluminescence light is obtained. From this spectrum, the above-described ratio of peak strengths is calculated.

Figure 2:
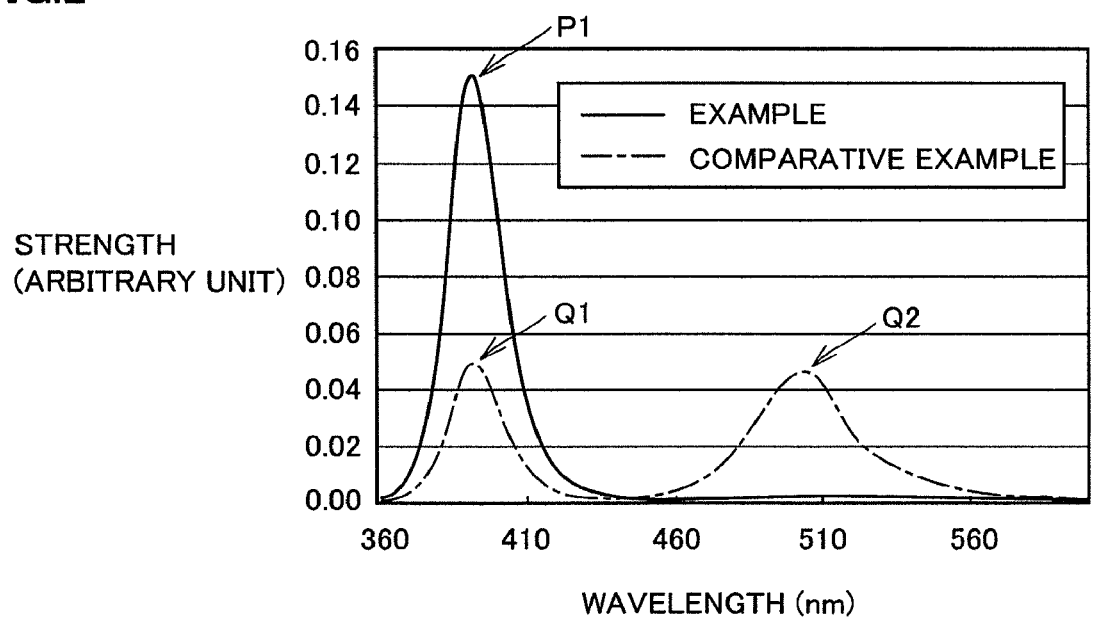
FIG. 2 shows an example for photoluminescence measurement at the backside surface of a substrate of FIG. 1, as well as a comparative example therefor.

Referring to FIG. 2, the following describes illustrative results of the photoluminescence measurement performed at a room temperature. The solid line represents a spectrum in a result of measurement for an example of the present embodiment, whereas the chain line represents a spectrum of a result of measurement for a comparative example. The spectrum of the comparative example had a peak Q1 in a wavelength of around 390 nm, and had a peak Q2 in a wavelength of around 500 nm. On the other hand, the spectrum of the example had a strong peak P1 in a wavelength of around 390 nm, but did not have an apparent peak in a wavelength of around 500 nm. Thus, the above-described ratio of peak strengths was substantially 0 in the example, whereas the ratio thereof was approximately 1 in the comparative example.

In the example, substrate 2 having backside surface 2B allowing the ratio of peak strengths to be substantially 0 was employed as follows. The present inventors have found that one of causes of increase of the resistivity of a substrate 2 made of SiC having a 4H type single-crystal structure is extension of stacking faults that are specified by the existence of the peak in a wavelength of around 500 nm in the photoluminescence measurement and that are formed from defects in a processing damage layer during the steps in manufacturing semiconductor device 1, in particular, during a step involving heating. To address this, the present inventors have considered to employ substrate 2 having less faults specified as described above, i.e., prepare substrate 2 having a small value of the above-described ratio of peak strengths, so as to suppress the increase of the resistivity of substrate 2 during the steps in manufacturing semiconductor device 1 to thereby achieve low on-resistance of semiconductor device 1. It should be noted that in the ratio of peak strengths, the peak in around 390 nm is determined as a denominator due to the following reason. That is, the peak in around 390 nm corresponds to an interband luminescence of SiC having an ideal 4H type single-crystal structure. Hence, it has been considered that the peak in around 500 nm, which corresponds to the faults, can be normalized by the peak in around 390 nm.

It should be noted that a method for preparing such a substrate 2 satisfying the above-described condition will be described later. Further, in the above-described example, the ratio is substantially 0, which is the most preferable, but the ratio does not need to be always substantially 0. When the ratio is 0.01 or smaller, a large effect is obtained. When the ratio is 0.1 or smaller, an effect is obtained.

Buffer layer 21 is made of silicon carbide, and is formed on main surface 2A of substrate 2. Buffer layer 21 has n type conductivity, and has a thickness of, for example, 0.5 μm. Further, buffer layer 21 can be adapted to contain an n type impurity at a concentration of, for example, $5 \times 10^{17}$ cm$^{-3}$. Formed on buffer layer 21 is breakdown voltage holding layer 22. Breakdown voltage holding layer 22 is made of silicon carbide of n type conductivity, and has a thickness of 10 μm, for example. Further, breakdown voltage holding layer 22 contains an n type impurity at a concentration of, for example, $5 \times 10^{15}$ cm$^{-3}$.

At a region including the main surface of breakdown voltage holding layer 22 opposite to substrate 2, p regions 23 of p type conductivity are formed with a space interposed therebetween. In each of p regions 23, n$^+$ region 24 is formed at a region including the main surface of p region 23. Further, at a location adjacent to n$^+$ region 24, a p$^+$ region 25 is formed. Oxide film 26 is formed to extend on n$^+$ region 24 in one p region 23, p region 23, an exposed portion of breakdown voltage holding layer 22 between the two p regions 23, the other p region 23, and n$^+$ region 24 in the other p region 23. Oxide film 26 can have a thickness of, for example, 40 nm. On oxide film 26, gate electrode 10 is formed. Further, source electrodes 11 are formed on and in contact with n$^+$ regions 24 and p$^+$ regions 25. On source electrodes 11, upper source electrodes 27 are formed. Moreover, drain electrode 12 is formed on the main surface (backside surface 2B) of substrate 2 opposite to its main surface on which buffer layer 21 is formed.

Here, the maximum value of a nitrogen atom concentration is $1 \times 10^{21}$ cm$^{-3}$ or greater in a region within 10 nm from an interface between oxide film 26 and the semiconductor layer, i.e., each of n$^+$ regions 24, p$^+$ regions 25, p regions 23, and breakdown voltage holding layer 22. This achieves improved mobility particularly in a channel region below oxide film 26 (a contact portion of each p region 23 with oxide film 26 between each of n$^+$ regions 24 and breakdown voltage holding layer 22).

Further, in semiconductor device 1, main surface 2A of substrate 2 at the buffer layer 21 side preferably has an off angle of not less than 50° and not more than 65° relative to a plane orientation of {0001}, more preferably has an off angle of approximately 53° relative thereto. The off angle may have an off orientation falling within a range of ±5° or smaller relative to the <11-20> direction. Alternatively, the off angle may have an off orientation falling within a range of ±5° or smaller relative to the <01-10> direction. In this case, preferably, main surface 2A has an off angle of not less than −3° and not more than +5° relative to the {03-38} plane in the <01-10> direction. More preferably, main surface 2A has an off angle of not less than −3° and not more than +5° relative to the (0-33-8) plane in the <01-10> direction. In this case, each of p regions 23 formed by epitaxial growth and impurity implantation to main surface 2A has a main surface opposite to substrate 2 and corresponding to substantially the (0-33-8) plane. As a result, carrier mobility (channel mobility) in the channel region can be particularly large.

The following describes a method for manufacturing semiconductor device 1.

Figure 3:
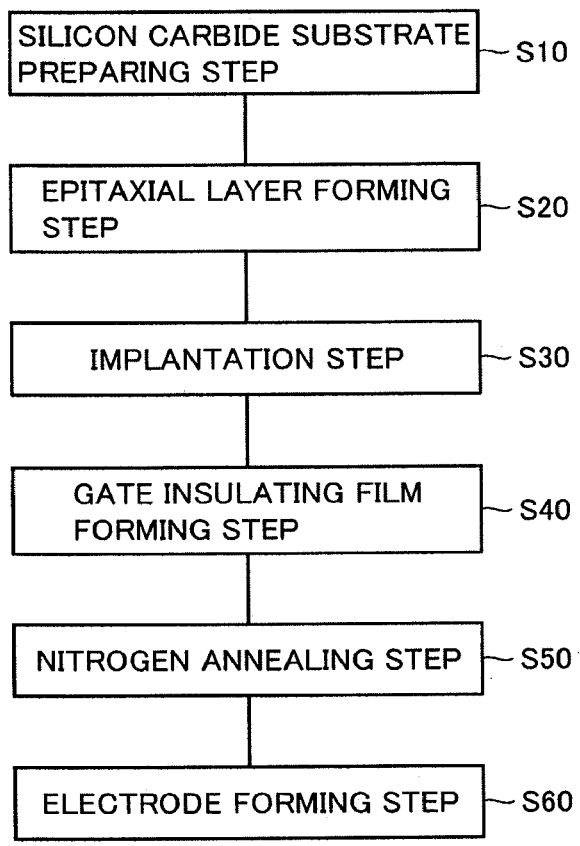
FIG. 3 is a flowchart for schematically illustrating a method for manufacturing the semiconductor device of FIG. 1.

First, a silicon carbide substrate preparing step S10 (FIG. 3) is performed. Prepared in this step as substrate 2 is a silicon carbide substrate having n type conductivity and having main surface 2A corresponding to the plane with a plane orientation of (0-33-8). Such a substrate can be obtained by means of, for example, a technique of cutting an ingot (source material crystal) having a main surface corresponding to the (0001) plane, to obtain the substrate having main surface 2A exposed and corresponding to the (0-33-8) plane. As substrate 2, a substrate may be employed which has n type conductivity and has a substrate resistance of 0.02 Ωcm, for example. Specifically, the following steps shown in FIG. 4 to FIG. 7 are performed.

Figure 4:
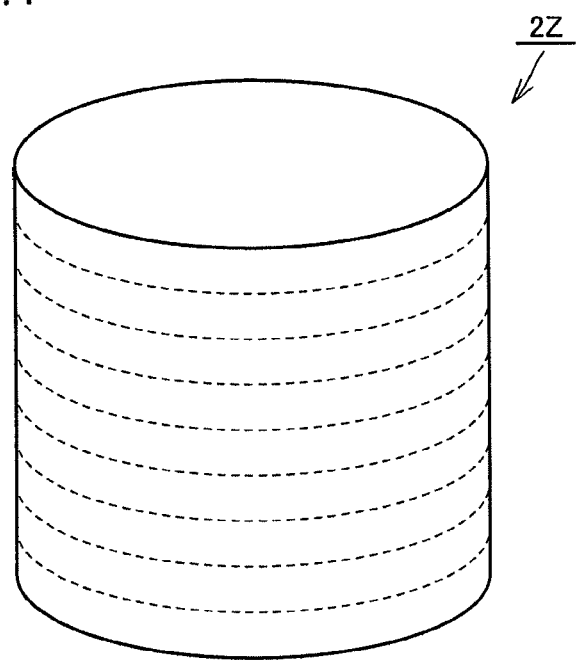
FIG. 4 is a perspective view schematically showing a first step of the method for manufacturing the semiconductor device of FIG. 1.

Referring to FIG. 4 first, an ingot 2Z made of SiC having a 4H type single-crystal structure is prepared. Next, ingot 2Z is sliced as indicated by broken lines in the figure.

Figure 5:
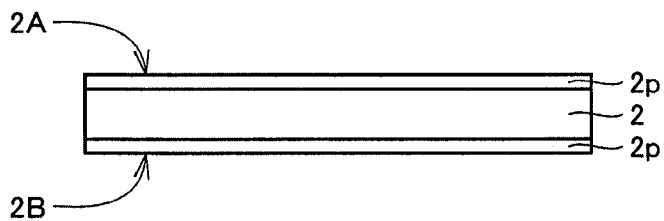
FIG. 5 is a cross sectional view schematically showing a second step of the method for manufacturing the semiconductor device of FIG. 1.

Further, referring to FIG. 5, as a result of this slicing process, substrate 2 having main surface 2A and backside surface 2B is obtained. Mechanical stress in this slicing process causes formation of processing damage layers 2p on main surface 2A and backside surface 2B. Each of processing damage layers 2p is a layer having a strain in its crystal structure, and has a thickness of, for example, approximately 10 μm.

Figure 6:
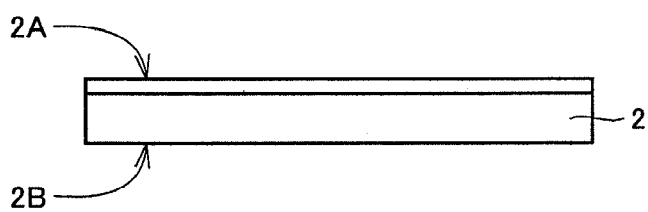
FIG. 6 is a cross sectional view schematically showing a third step of the method for manufacturing the semiconductor device of FIG. 1.

Further, referring to FIG. 6, at least a portion, preferably, all of processing damage layer 2p on backside surface 2B is removed. For the removal of processing damage layer 2p on backside surface 2B, for example, at least one of the following methods can be used: a method employing fused KOH etching; a method employing dry etching; a method employing thermal etching; and a method employing polishing. Here, the thermal etching refers to a method for removing SiC mainly by high temperature heating. Specifically, for the thermal etching, one of the following methods can be also used: a method of sublimating SiC; and a method of removing SiC by exposing SiC to a specific atmosphere at a high temperature. An exemplary, usable specific atmosphere includes hydrogen atmosphere, chlorine atmosphere, or hydrogen chloride atmosphere. An alternative method is to form an oxidized layer by oxidizing the surface of backside surface 2B and then remove this oxidized layer by means of wet etching. Another alternative method is to form a carbonized layer by carbonizing the surface of backside surface 2B and then remove this carbonized layer.

Preferably, processing damage layer 2p on backside surface 2B is removed by means of a chemical method instead of a mechanical method or a physical method, so as not to form a new processing damage layer when removing processing damage layer 2p. Meanwhile, if processing damage layer 2p is removed using the mechanical method, the removal is performed under conditions allowing for mechanical damage as small as possible. Specifically, CMP (Chemical Mechanical Polishing) is more preferable than a simple mechanical polishing. If the simple mechanical polishing is performed, it is preferable to use a polishing material having a particle diameter of approximately 3 μm or smaller.

Figure 7:
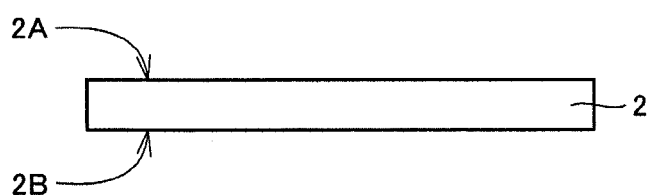
FIG. 7 is a cross sectional view schematically showing a fourth step of the method for manufacturing the semiconductor device of FIG. 1.

Further, referring to FIG. 7, lapping is performed to main surface 2A. This lapping is a relatively rough polishing step, and preferably employs a polishing material having a particle diameter exceeding 3 μm. Next, main surface 2A is mechanically polished using a polishing material having a smaller particle diameter. This particle diameter is preferably not less than 0.5 μm and not more than 3 μm. Next, main surface 2A is subjected to CMP. Accordingly, processing damage layer 2p on main surface 2A is substantially removed.

In the description above, main surface 2A is subjected to the lapping, the mechanical polishing, and then the CMP. In other words, the polishing is performed such that polishing rate gradually becomes smaller. Meanwhile, such gradual polishing is not necessarily required for backside surface 2B, as long as a step of removing processing damage layer 2p is performed. This difference is due to the following reason. That is, the step performed onto main surface 2A is mainly intended to smooth main surface 2A, whereas the step performed onto backside surface 2B is mainly intended to remove processing damage layer 2p on backside surface 2B. Further, in FIG. 6, only the processing damage layer on backside surface 2B is removed. However, when the method employing the fused KOH etching or the like is utilized, the damaged layer on main surface 2A is also removed simultaneously. As described above, main surface 2A requires polishing for smoothing. Hence, polishing is required with its polishing rate being gradually smaller, because the lapping reintroduces processing damage.

In this way, substrate 2 used for the steps in manufacturing semiconductor device 1 is prepared. Substrate 2 thus prepared has a slight processing damage layer 2p on backside surface 2B or has no processing damage layer 2p on backside surface 2B.

At this point of time, the above-described photoluminescence measurement was performed to backside surface 2B of substrate 2. An obtained result thereof was similar to the result for backside surface 2B of substrate 2 obtained when semiconductor substrate 1 was finally obtained. In other words, the above-defined ratio of peak strengths was substantially 0.

Figure 8:
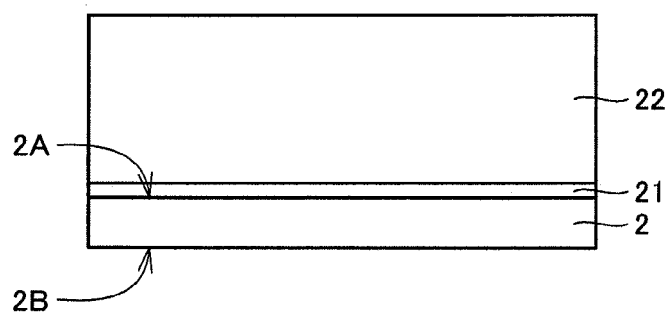
FIG. 8 is a cross sectional view schematically showing a fifth step of the method for manufacturing the semiconductor device of FIG. 1.

Referring to FIG. 8, an epitaxial layer forming step S20 (FIG. 3) is performed. Specifically, buffer layer 21 is formed on main surface 2A of substrate 2. As the buffer layer, an epitaxial layer is formed which is made of silicon carbide of n type conductivity and has a thickness of 0.5 μm, for example. Buffer layer 21 contains an impurity at a concentration of, for example, $5 \times 10^{17}$ cm$^{-3}$. Then, on buffer layer 21, breakdown voltage holding layer 22 is formed as shown in FIG. 8. As breakdown voltage holding layer 22, a layer made of silicon carbide of n type conductivity is formed using an epitaxial growth method. Breakdown voltage holding layer 22 has a thickness of, for example, 10 μm. Further, breakdown voltage holding layer 22 includes an impurity of n type conductivity at a concentration of, for example, $5 \times 10^{15}$ cm$^{-3}$.

Figure 9:
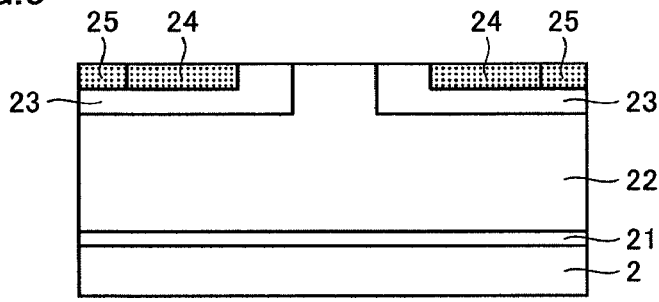
FIG. 9 is a cross sectional view schematically showing a sixth step of the method for manufacturing the semiconductor device of FIG. 1.

Referring to FIG. 9, next, an implantation step S30 (FIG. 3) is performed. Specifically, an impurity of p type conductivity (for example, aluminum (Al)) is implanted into breakdown voltage holding layer 22 using, as a mask, an oxide film formed through photolithography and etching, thereby forming p regions 23. Further, after removing the oxide film thus used, an oxide film having a new pattern is formed through photolithography and etching. Using this oxide film as a mask, an n type impurity is implanted into predetermined regions to form n$^+$ regions 24. An exemplary, usable n type impurity is phosphorus (P). In a similar way, an impurity of p type conductivity is implanted to form p$^+$ regions 25.

After such an implantation step, an activation annealing treatment is performed. This activation annealing treatment can be performed under conditions that, for example, argon gas is employed as atmospheric gas, heating temperature is set at 1700° C., and heating time is set at 30 minutes.

Figure 10:
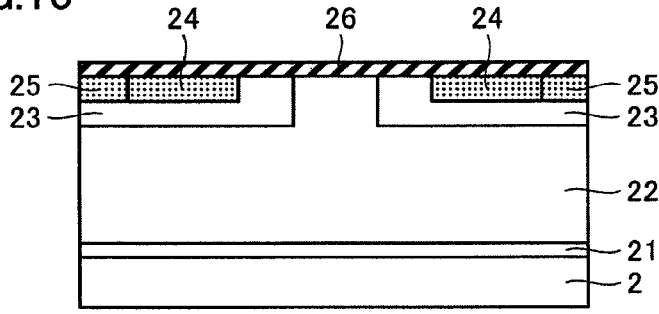
FIG. 10 is a cross sectional view schematically showing a seventh step of the method for manufacturing the semiconductor device of FIG. 1.

Referring to FIG. 10, a gate insulating film forming step S40 (FIG. 3) is performed. Specifically, oxide film 26 (insulating film) is formed to cover breakdown voltage holding layer 22, p regions 23, regions 24, and p$^+$ regions 25. Preferably, this oxide film 26 is a thermal oxidation film formed by performing dry oxidation (thermal oxidation) onto the semiconductor layer. In this case, oxide film 26 is made of an oxide of the material of the semiconductor layer. This dry oxidation includes a heating step. This heating step is performed, for example, at a heating temperature of 1200° C. for a heating time of 120 minutes.

Thereafter, nitrogen annealing step S50 (FIG. 3) is performed. Specifically, an annealing treatment is performed in atmospheric gas of nitrogen monoxide (NO). Temperature conditions for this annealing treatment are, for example, as follows: the heating temperature is 1100° C. and the heating time is 120 minutes. As a result, nitrogen atoms are introduced into a vicinity of the interface between oxide film 26 and each of breakdown voltage holding layer 22, p regions 23, n$^+$ regions 24, and p$^+$ regions 25, which are disposed below oxide film 26. Further, after the annealing step using the atmospheric gas of nitrogen monoxide, additional annealing may be performed using argon (Ar) gas, which is an inert gas. Specifically, using the atmospheric gas of argon gas, the additional annealing may be performed under conditions that the heating temperature is set at 1100° C. and the heating time is set at 60 minutes.

Figure 11:
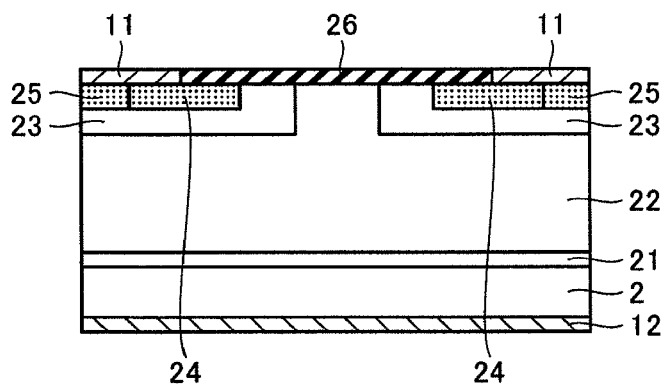
FIG. 11 is a cross sectional view schematically showing an eighth step of the method for manufacturing the semiconductor device of FIG. 1.

Referring to FIG. 11, an electrode forming step S60 (FIG. 3) is performed. Specifically, a resist film having a pattern is formed on oxide film 26 by means of the photolithography method. Using the resist film as a mask, portions of the oxide film above n$^+$ regions 24 and p$^+$ regions 25 are removed by etching. Thereafter, a conductor film made of metal or the like is formed on the resist film, on the region making contact with n$^+$ region 24 and p$^+$ region 25 in each of the openings formed in oxide film 26, and on the main surface of substrate 2 opposite to buffer layer 21. Thereafter, the resist film is removed, thus removing (lifting off) the conductive film's portions located on the resist film. Here, as the conductor, nickel (Ni) can be used, for example. As a result, source electrodes 11 and drain electrode 12 can be obtained. It should be noted that on this occasion, heat treatment for alloying is preferably performed. Specifically, using atmospheric gas of argon (Ar) gas, which is an inert gas, the heat treatment (alloying treatment) is performed with the heating temperature being set at 950° C. and the heating time being set at 2 minutes, for example. Thereafter, on source electrodes 11, upper source electrodes 27 (see FIG. 1) are formed.

Thereafter, gate electrode 10 (see FIG. 1) is formed on oxide film 26 serving as the gate insulating film. As a method of forming gate electrode 10, the following method can be used. For example, a resist film having an opening pattern at a region above oxide film 26 is formed in advance, and a conductor film to constitute the gate electrode is formed to cover the entire surface of the resist film. Then, by removing the resist film, portions of the conductor film other than the portion to be formed into the gate electrode are removed (lifted off). As a result, as shown in FIG. 1, gate electrode 10 is formed. In this way, semiconductor device 1 shown in FIG. 1 can be obtained.

Figure 12:
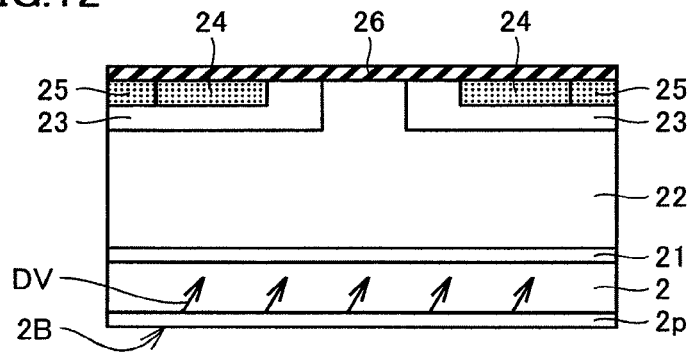
FIG. 12 is a cross sectional view schematically showing one step of a method for manufacturing a semiconductor device of the comparative example.

The following describes a method for manufacturing the semiconductor device of the comparative example (FIG. 12). In this comparative example, unlike the present embodiment (FIG. 7), a substrate having a processing damage layer 2p on its backside surface 2B is prepared and the same steps as those in FIG. 8 to FIG. 11 are performed using this substrate. These steps include a plurality of steps involving heating. In each of the heating steps, stacking faults are likely to be extended as indicated by arrows DV (FIG. 12). Further, this direction of extension is a direction perpendicular to the <0001> direction, such as the <11-20> direction. Hence, as the off angle is larger relative to the {0001} plane, the stacking faults are more likely to be extended in substrate 2. With such extension of stacking faults, the resistivity of substrate 2 becomes large.

The following describes a result of verifying that the increase of the resistivity of substrate 2 is suppressed by the present embodiment. This verification was performed as follows. That is, a substrate 2 was employed which was obtained from an ingot by cutting to have an off angle of 8° relative to the (0001) plane and which had a thickness of 400 μm. Then, sheet resistance (unit: mΩ/□) thereof was measured. It should be noted that the measurement of the sheet resistance of substrate 2 is hardly influenced by presence or absence of the semiconductor layer on substrate 2. This is because the sheet resistance is a value regarding resistance in the lateral direction (in-plane direction) and therefore the resistance of substrate 2 is more dominant than that of the semiconductor layer.

First, the following describes a change in the sheet resistance of substrate 2 of the example of the present embodiment. At the stage in which substrate 2 was prepared (FIG. 7), the sheet resistance thereof was 520 mΩ/□. At the stage in which breakdown voltage holding layer 22 was formed (FIG. 8), the sheet resistance was hardly changed, i.e., was 520 mΩ/□. At the stage in which oxide film 26 was formed through heat treatment performed at a temperature of 1200° C. for 120 minutes (FIG. 10), the sheet resistance was hardly changed, i.e., 520 mΩ/□. Namely, in the present example, the sheet resistance of substrate 2 was hardly changed during the steps in manufacturing semiconductor device 1.

The following describes a change of the sheet resistance of the substrate in the comparative example (FIG. 12). Unlike the example, in the substrate of the comparative example, processing damage layer 2p on backside surface 2B was not removed. Specifically, the substrate having processing damage layer 2p on its backside surface 2B was first prepared. At this point, the sheet resistance thereof was 500 mΩ/□. At the stage in which breakdown voltage holding layer 22 was formed (corresponding to FIG. 8), the sheet resistance thereof was slightly increased to 530 mΩ/□. At the stage in which oxide film 26 was formed through heat treatment at a temperature of 1200° C. for 120 minutes (corresponding to FIG. 10), the sheet resistance was drastically increased to 900 mΩ/□. In other words, in the comparative example, the sheet resistance of substrate 2 was increased during the steps in manufacturing semiconductor device 1, in particular, was drastically increased after the strong heat treatment. Further, as a result of performing the measurement of the sheet resistance by removing the backside surface of the substrate by 100 μm, it was found that the resistivity of this removed portion was approximately 1.3 times as large as that of the remaining portion. Namely, the substrate of the comparative example has a particularly high resistivity in the vicinity of the backside surface.

It should be noted that the temperature of the heat treatment, which greatly increases the resistivity of the substrate having processing damage layer 2p on backside surface 2B as described above, is not limited to 1200° C. Specifically, the increase of the resistivity can be caused by heat treatment of, for example, 1000° C. to 1200° C.

As a result of the verification, according to the present embodiment, it has been found that the increase of the resistivity of substrate 2 can be suppressed during the steps in manufacturing semiconductor device 1, in particular, the increase of the resistivity thereof in the vicinity of backside surface 2B can be suppressed. With the increase of the resistivity being thus suppressed, it is considered that semiconductor device 1 of the present embodiment has a low on-resistance.

Second Embodiment

Figure 13:
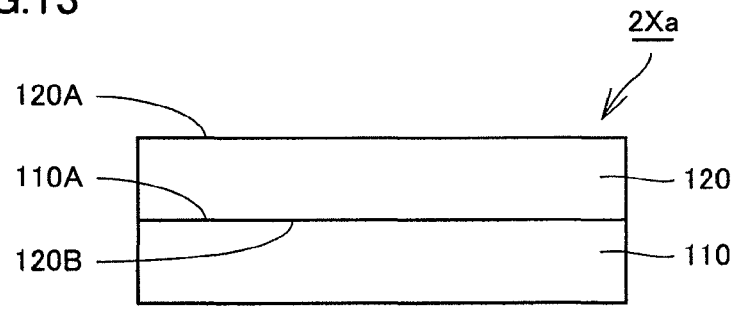
FIG. 13 is a cross sectional view schematically showing a configuration of a combined substrate used for manufacturing of a semiconductor device in a second embodiment.

Referring to FIG. 13, a semiconductor device in the present embodiment has a combined substrate 2Xa instead of substrate 2 of semiconductor device 1 (FIG. 1) of the foregoing first embodiment. Combined substrate 2Xa includes a base layer 110 made of SiC, and a substrate 120 disposed on one main surface 110A of base layer 110. Substrate 120 is configured the same as substrate 2 (FIG. 7: the first embodiment), and has a main surface 120A corresponding to main surface 2A of substrate 2, and has a backside surface 120B corresponding to the backside surface of substrate 2. It should be noted that in the present embodiment, drain electrode 12 is provided on backside surface 120B with base layer 110 interposed therebetween. Further, base layer 110 and substrate 120 are made of different crystals. Substrate 120 has a defect density smaller than that of base layer 110.

Further, with existence of an interface between base layer 110 and substrate 120, defects of base layer 110 are suppressed from being propagated into substrate 120. On this occasion, base layer 110 and substrate 120 may be directly connected to each other or may be connected to each other via an intermediate layer.

It is difficult for a high-quality SiC single-crystal to have a large diameter. Meanwhile, for efficient manufacturing in a process of manufacturing a semiconductor device using a SiC substrate, a substrate provided with predetermined uniform shape and size is required. Hence, even when a high-quality SiC single-crystal (for example, silicon carbide single-crystal having a small defect density) is obtained, a region that cannot be processed into such a predetermined shape and the like by cutting, etc., may not be effectively used.

To address this, combined substrate 2Xa constituting the semiconductor device of the present embodiment includes base layer 110 made of SiC, and substrate 120 made of single-crystal SiC and disposed on base layer 110, wherein substrate 120 has a defect density smaller than that of base layer 110. Thus, base substrate 110 formed of low-quality SiC crystal having a large defect density is processed to have the above-described predetermined shape and size, thereby obtaining base layer 110. On such a base layer 110, a high-quality SiC single-crystal not shaped into the desired shape and the like can be disposed as substrate 120. Combined substrate 2Xa thus obtained has the predetermined uniform shape and size, thus attaining efficient manufacturing of semiconductor devices. Further, combined substrate 2Xa thus obtained utilizes such a high-quality substrate 120 to manufacture a semiconductor device 1, thereby effectively utilizing SiC single-crystal. As a result, according to the semiconductor device of the present invention, there can be provided a semiconductor device allowing for reduced manufacturing cost.

Further, the half width of X-ray rocking curve of substrate 120 may be smaller than that of base layer 110.

Substrate 120 preferably has a micro pipe density smaller than that of base layer 110. Further, substrate 120 preferably has a threading screw dislocation density smaller than that of base layer 110. Further, substrate 120 preferably has a threading edge dislocation density smaller than that of base layer 110. Further, substrate 120 preferably has a basal plane dislocation density smaller than that of base layer 110. Further, substrate 120 preferably has a composite dislocation density smaller than that of base layer 110. Further, substrate 120 preferably has a stacking fault density smaller than that of base layer 110. Further, substrate 120 preferably has a point defect density smaller than that of base layer 110.

Thus, as compared with base layer 110, substrate 120 has the reduced defect densities such as the micro pipe density, the threading screw dislocation density, the threading edge dislocation density, the basal plane dislocation density, the composite dislocation density, the stacking fault density, and the point defect density. Such a substrate 120 allows a high-quality active layer (epitaxial growth layer) to be formed on substrate 120.

The following describes a method for manufacturing combined substrate 2Xa in the present embodiment.

Figure 14:
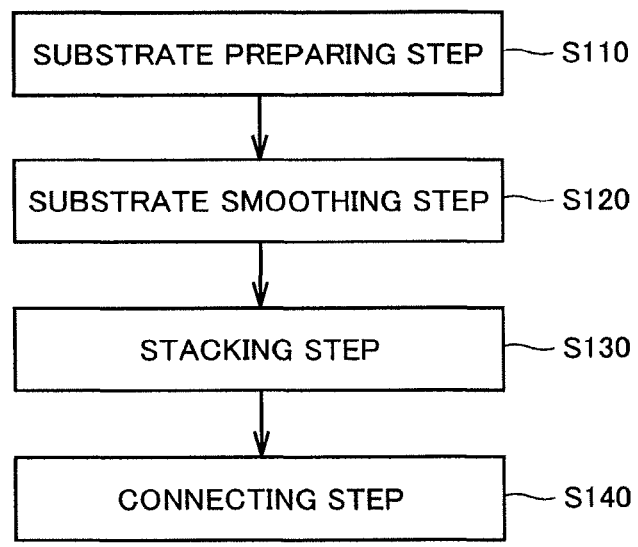
FIG. 14 is a flowchart for schematically illustrating a method for manufacturing the combined substrate shown in FIG. 13.

Referring to FIG. 14, a substrate preparing step is first performed as a step S110. In this step, referring to FIG. 13, substrate 120 and base substrate 110, which is made of, for example, single-crystal SiC, are prepared. The processing damage layer on backside surface 120B of substrate 120 is removed in the same manner as backside surface 2B of substrate 2 (FIG. 6 and FIG. 7).

Substrate 120 has main surface 120A, which will be the main surface of combined substrate 2Xa that will be obtained by this manufacturing method. Hence, on this occasion, the plane orientation of main surface 120A of substrate 120 is selected in accordance with desired plane orientation of the main surface. Here, for example, a substrate 120 having a main surface corresponding to the (0-33-8) plane is prepared. Meanwhile, a substrate having an impurity concentration greater than, for example, $2 \times 10^{19}$ cm$^{-3}$ is adopted as base layer 110. For substrate 120, a substrate is employed which has an impurity concentration of more than $5 \times 10^{18}$ cm$^{-3}$ and less than $2 \times 10^{19}$ cm$^{-3}$, for example.

Next, a substrate smoothing step is performed as a step S120. This step is not an essential step, but can be performed when the smoothness of base layer 110 and/or substrate 120 prepared in step S110 is insufficient. Specifically, for example, the main surface(s) of base layer 110 and/or substrate 120 are polished. On the other hand, when this step is omitted, manufacturing cost can be reduced.

Next, the stacking step is performed as a step S130. Specifically, as shown in FIG. 13, base layer 110 and substrate 120 are stacked on each other to bring main surface 110A of base layer 110 and backside surface 120B of substrate 120 into contact with each other.

Next, as a step S140, a connecting step is performed. Specifically, by heating base layer 110 and substrate 120 stacked on each other to fall within, for example, a range of temperature equal to or greater than the sublimation temperature of SiC, base layer 110 and substrate 120 are connected to each other. Accordingly, combined substrate 2Xa (FIG. 13) is obtained. Further, in the method for manufacturing the semiconductor device in the present embodiment, semiconductor device 1 is manufactured in the same manner as in the first embodiment, using this combined substrate 2Xa.

Here, heating temperature for the stacked substrate in step S140 is preferably not less than 1800° C. and not more than 2500° C. If the heating temperature is lower than 1800° C., it takes a long time to connect base layer 110 and substrate 120, which results in decreased efficiency in manufacturing combined substrate 2Xa. On the other hand, if the heating temperature exceeds 2500° C., surfaces of base layer 110 and substrate 120 become rough, which may result in generation of a multiplicity of defects in combined substrate 2Xa to be fabricated. In order to improve efficiency in manufacturing while further restraining generation of defects in combined substrate 2Xa, the heating temperature for the stacked substrate in step S140 is preferably set at not less than 1900° C. and not more than 2100° C. Further, the above-described connection can be achieved using a simple device by setting a pressure of the atmosphere during the heating in step S140, at not less than $10^{-5}$ Pa and not more than $10^6$ Pa, more preferably, not less than $10^{-2}$ Pa and not more than $10^4$ Pa, further preferably, not less than $10^{-1}$ Pa and not more than $10^4$ Pa. Further, the atmosphere during the heating in step S140 may be obtained by reducing pressure of atmospheric air. Alternatively, the atmosphere may be the inert gas atmosphere. In this case, the inert gas atmosphere preferably contains at least one selected from a group consisting of argon, helium, and nitrogen.

Third Embodiment

The following describes another method for manufacturing the combined substrate (FIG. 13: the second embodiment) constituting the semiconductor device, with reference to FIG. 15 to FIG. 18. A method for manufacturing the combined substrate in the third embodiment is performed in basically the same manner as in the second embodiment. However, the method for manufacturing the combined substrate in the third embodiment is different from that of the second embodiment in terms of a process of forming base substrate 110.

Figure 15:
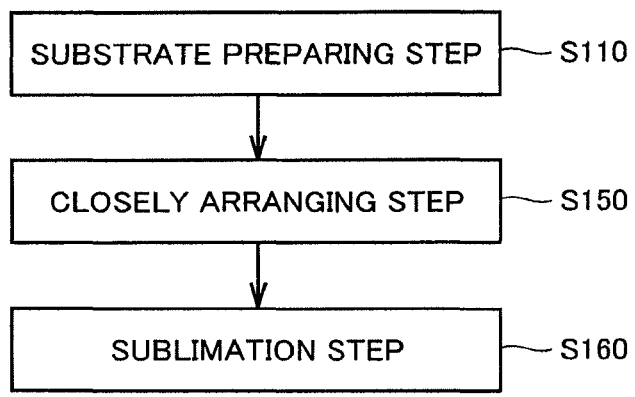
FIG. 15 is a flowchart for schematically illustrating a method for manufacturing a combined substrate used for manufacturing of a semiconductor device in a third embodiment.
Figure 16:
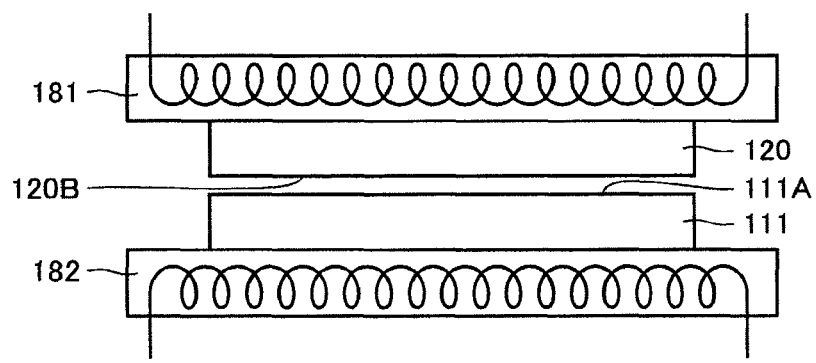
FIG. 16 is a cross sectional view schematically showing a first step of the method for manufacturing the combined substrate used for manufacturing of the semiconductor device in the third embodiment.

Referring to FIG. 15, the substrate preparing step is first performed as step S110. Specifically, as shown in FIG. 16, substrate 120 is prepared as with the second embodiment, and a material substrate 111 made of SiC is prepared. Material substrate 111 may be made of single-crystal SiC or polycrystal SiC, or may be a sintered compact of SiC. Further, instead of material substrate 111, material powder made of SiC can be employed.

Next, as a step S150, a closely arranging step is performed. Specifically, as shown in FIG. 16, substrate 120 and material substrate 111 are held by a first heater 181 and a second heater 182 disposed face to face each other. On this occasion, substrate 120 and material substrate 111 are closely arranged with a space of not less than 1 μm and not more than 1 cm, for example a space of approximately 1 mm, therebetween such that their the main surfaces, i.e., main surface 120B and main surface 111A face each other.

Figure 17:
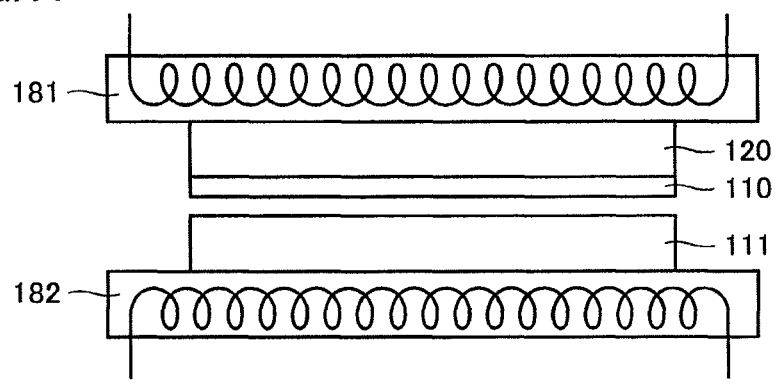
FIG. 17 is a cross sectional view schematically showing a second step of the method for manufacturing the combined substrate used for manufacturing of the semiconductor device in the third embodiment.
Figure 18:
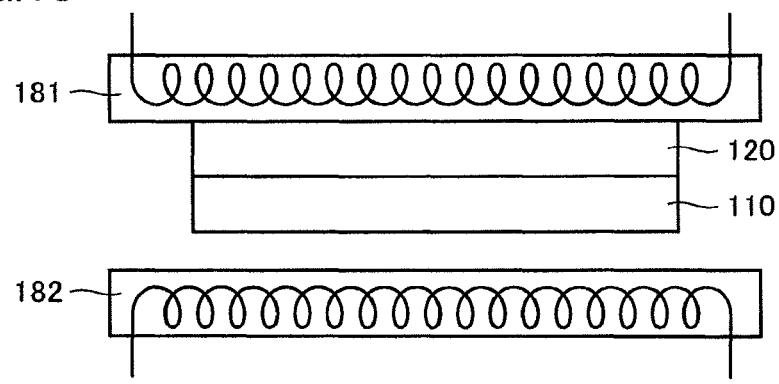
FIG. 18 is a cross sectional view schematically showing a third step of the method for manufacturing the combined substrate used for manufacturing of the semiconductor device in the third embodiment.

Next, as a step S160, a sublimation step is performed. In this step S160, substrate 120 is heated to a predetermined substrate temperature by first heater 181. Further, material substrate 111 is heated to a predetermined material temperature by second heater 182. On this occasion, material substrate 111 is heated to reach the material temperature, thereby sublimating SiC from the surface of material substrate 111. On the other hand, the substrate temperature is set lower than the material temperature. Specifically, for example, the substrate temperature is set lower than the material temperature by not less than 1° C. and not more than 100° C. The substrate temperature is 1800° C. or greater and 2500° C. or smaller, for example. Accordingly, as shown in FIG. 17, SiC sublimated from material substrate 111 in the form of gas reaches the surface of substrate 120 and is accordingly solidified thereon, thereby forming base layer 110. With this state being maintained, as shown in FIG. 18, all the SiC constituting material substrate 111 is sublimated and is transferred onto the surface of substrate 120. Accordingly, step S160 is completed, thereby completing substrate 2 shown in FIG. 13.

It should be noted that the pressure of the atmosphere used in step S160 is preferably not less than $10^{-5}$ Pa and not more than $10^6$ Pa, more preferably, not less than $10^{-2}$ Pa and not more than $10^4$ Pa, further preferably, not less than $10^{-1}$ Pa and not more than $10^4$ Pa. Further, this atmosphere may be obtained by reducing pressure of the atmospheric air. Alternatively, the atmosphere may be the inert gas atmosphere. In this case, the inert gas atmosphere preferably contains at least one selected from a group consisting of argon, helium, and nitrogen.

Fourth Embodiment

A semiconductor device in the present embodiment has basically the same structure as that of the second or third embodiment. However, a combined substrate prepared during the step in manufacturing the semiconductor device in the fourth embodiment is different from that of the second or third embodiment.

Figure 19:
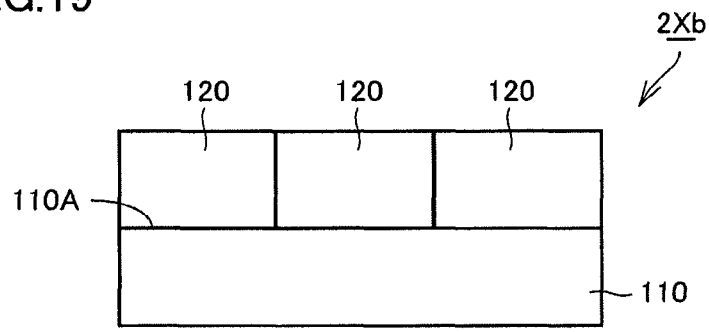
FIG. 19 is a cross sectional view schematically showing a configuration of a combined substrate used for manufacturing of a semiconductor device in a fourth embodiment.

Referring to FIG. 19, a combined substrate 2Xb prepared in the method for manufacturing the semiconductor device in the fourth embodiment has a plurality of substrates 120, each of which is disposed on base layer 110. Preferably, the plurality of layers 120 are arranged in the form of a matrix on base layer 110 such that adjacent substrates 120 are in contact with each other. Accordingly, during the steps in manufacturing the semiconductor device, combined substrate 2Xb can be handled as a substrate having a large diameter and having the plurality of high-quality substrates 120. Accordingly, the process of manufacturing the semiconductor device can become efficient.

Combined substrate 2Xb in the present embodiment can be manufactured in a manner similar to that in the second embodiment or the third embodiment as follows. That is, in step S130 of the second embodiment, a plurality of substrates 120 are arranged side by side on base layer 110 when viewed in a plan view (see FIG. 13). Alternatively, in step S150 of the third embodiment, a plurality of substrates 120 are arranged side by side on and held by first heater 181 when viewed in a plan view (see FIG. 16). Further, in the arrangement of the plurality of substrates 120, a minimum space between the plurality of substrates 120 (minimum space in a lateral direction in FIG. 19) is preferably 5 mm or smaller, more preferably, 1 mm or smaller, further preferably 100 μm or smaller, and particularly preferably 10 μm or smaller.

It should be noted that the semiconductor device to be finally obtained will be formed through a dicing step after completion of the steps involved with the substrate, and includes only one of the plurality of substrates 120. Hence, the semiconductor device of the present embodiment is similar to that of the second or third embodiment.

Fifth Embodiment

The following describes still another method for manufacturing the combined substrate. A semiconductor device in the present embodiment has basically the same structure and provides basically the same effects as those of the semiconductor device in the second embodiment. However, the semiconductor device in the fifth embodiment is different from that of the second embodiment in terms of structure of the combined substrate.

Figure 20:
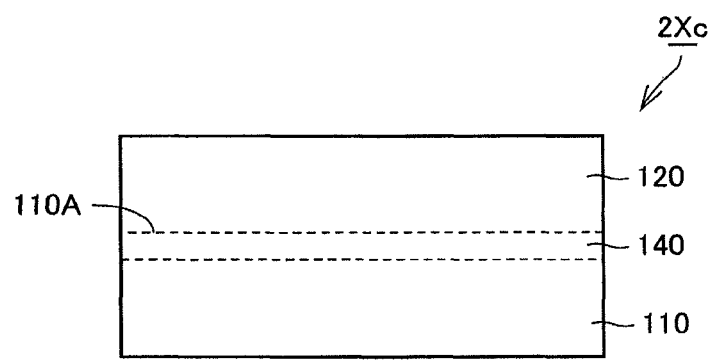
FIG. 20 is a cross sectional view schematically showing a configuration of a combined substrate used for manufacturing of a semiconductor device in a fifth embodiment.

Referring to FIG. 20, in combined substrate 2Xc in the fifth embodiment, an amorphous SiC layer 140 is disposed between base layer 110 and substrate 120 as an intermediate layer made of amorphous SiC. Then, base layer 110 and substrate 120 are connected to each other by this amorphous SiC layer 140. Amorphous layer 140 thus existing facilitates connection between base layer 110 and substrate 120 different in impurity concentration, for example.

The following describes a method for manufacturing combined substrate 2Xc in the fifth embodiment.

Figure 21:
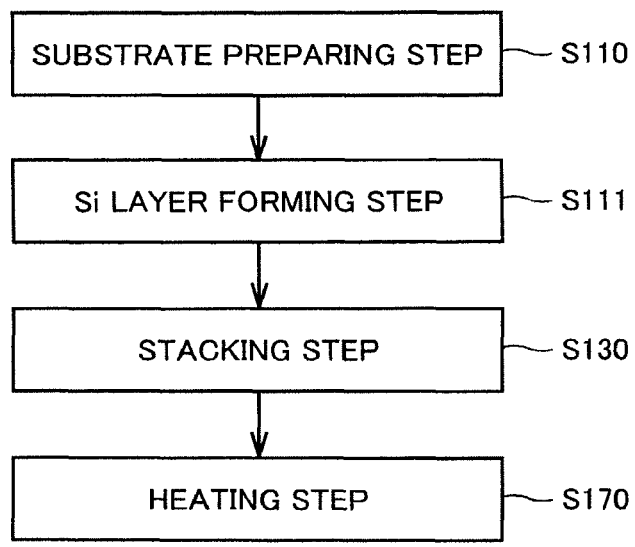
FIG. 21 is a flowchart for schematically illustrating a method for manufacturing the combined substrate shown in FIG. 20.

Referring to FIG. 21, the substrate preparing step is first performed as step S110 in the same way as in the second embodiment, so as to prepare base layer 110 and substrate 120.

Next, a Si layer forming step is performed as a step S111. In this step S111, a Si layer having a thickness of approximately 100 nm is formed on one main surface of base layer 110 prepared in step S110, for example. This Si layer can be formed using the sputtering method, for example.

Next, the stacking step is performed as step S130. In this step S130, substrate 120 prepared in step S110 is placed on the Si layer formed in step S111. In this way, a stacked substrate is obtained in which substrate 120 is provided over base layer 110 with the Si layer interposed therebetween.

Next, as a step S170, a heating step is performed. In this step S170, the stacked substrate fabricated in step S130 is heated, for example, in a mixed gas atmosphere of hydrogen gas and propane gas under a pressure of $1 \times 10^3$ Pa at approximately 1500° C. for 3 hours. Accordingly, the Si layer is supplied with carbon as a result of diffusion mainly from base layer 110 and substrate 120, thereby forming amorphous SiC layer 140 as shown in FIG. 20. Accordingly, combined substrate 2Xc of the fifth embodiment can be readily manufactured in which base layer 110 and substrate 120 different from each other in impurity density are connected to each other by amorphous SiC layer 140, for example.

Sixth Embodiment

Figure 22:
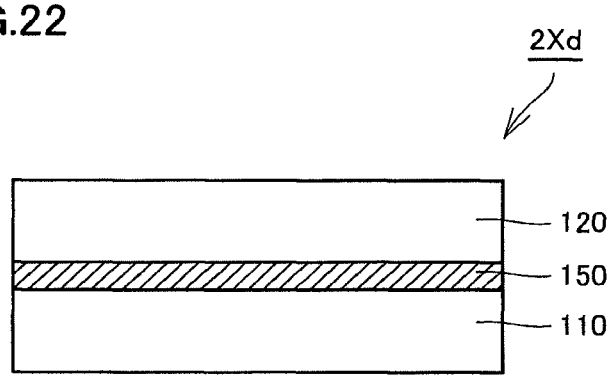
FIG. 22 is a cross sectional view schematically showing a configuration of a combined substrate used for manufacturing of a semiconductor device in a sixth embodiment.

Referring to FIG. 22, a combined substrate 2Xd in the present embodiment is different from that of the second embodiment in that an ohmic contact layer 150 is formed between base layer 110 and substrate 120 as an intermediate layer, which is formed by siliciding at least a portion of a metal layer. Base layer 110 and substrate 120 are connected to each other by ohmic contact layer 150. Ohmic contact layer 150 thus existing facilitates fabrication of combined substrate 2Xd in which base layer 110 and substrate 120 different in impurity concentration are stacked on each other, for example.

The following describes a method for manufacturing combined substrate 2Xd.

Figure 23:
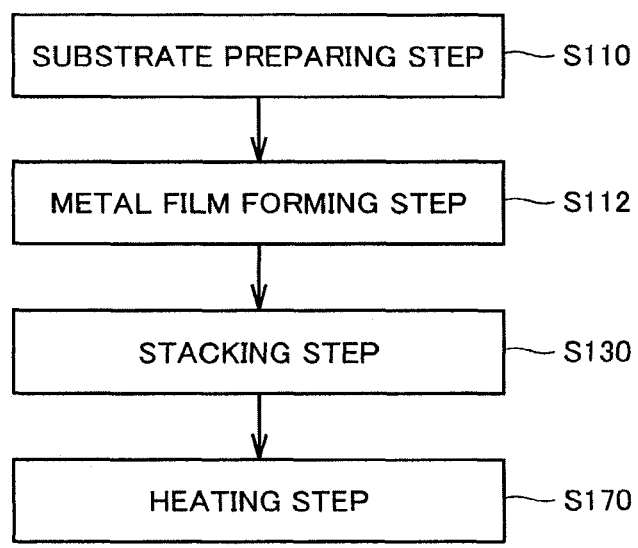
FIG. 23 is a flowchart for schematically illustrating a method for manufacturing the combined substrate shown in FIG. 22.

Referring to FIG. 23, the substrate preparing step is first performed as step S110 in the same way as in the second embodiment, so as to prepare base layer 110 and substrate 120.

Next, a metal film forming step is performed as a step S112. In this step S112, the metal film is formed by, for example, depositing the metal on one main surface of base layer 110 prepared in step S110. This metal film includes, for example, at least one of metals forming silicide when being heated, such as nickel, molybdenum, titanium, aluminum, and tungsten.

Next, the stacking step is performed as a step S130. In this step S130, substrate 120 prepared in step S110 is placed on the metal film formed in step S112. In this way, a stacked substrate is obtained in which substrate 120 is provided over base substrate 110 with the metal film interposed therebetween.

Next, as a step S170, a heating step is performed. In this step S170, the stacked substrate fabricated in step S130 is heated to approximately 1000° C. in an inert gas atmosphere such as argon, for example. In this way, at least a portion of the metal film (a region thereof making contact with base layer 110 and a region thereof making contact with the SiC substrate) is silicided to form ohmic contact layer 150 making ohmic contact with base layer 110 and substrate 120. As a result, combined substrate 2Xd can be readily manufactured in which base layer 110 and substrate 120 different in impurity concentration are connected to each other by ohmic contact layer 150, for example.

Seventh Embodiment

Figure 24:
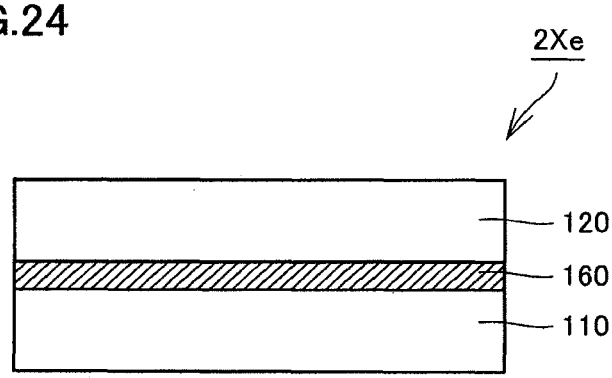
FIG. 24 is a cross sectional view schematically showing a configuration of a combined substrate used for manufacturing of a semiconductor device in a seventh embodiment.

Referring to FIG. 24, combined substrate 2Xe of the present embodiment is different from that of the second embodiment in that a carbon layer 160 is formed between base layer 110 and substrate 120 as an intermediate layer. Then, base layer 110 and substrate 120 are connected to each other by this carbon layer 160. Carbon layer 160 thus existing facilitates fabrication of combined substrate 2Xe in which base layer 110 and substrate 120 different in impurity concentration are stacked on each other, for example.

The following describes a method for manufacturing combined substrate 2Xe.

Figure 25:
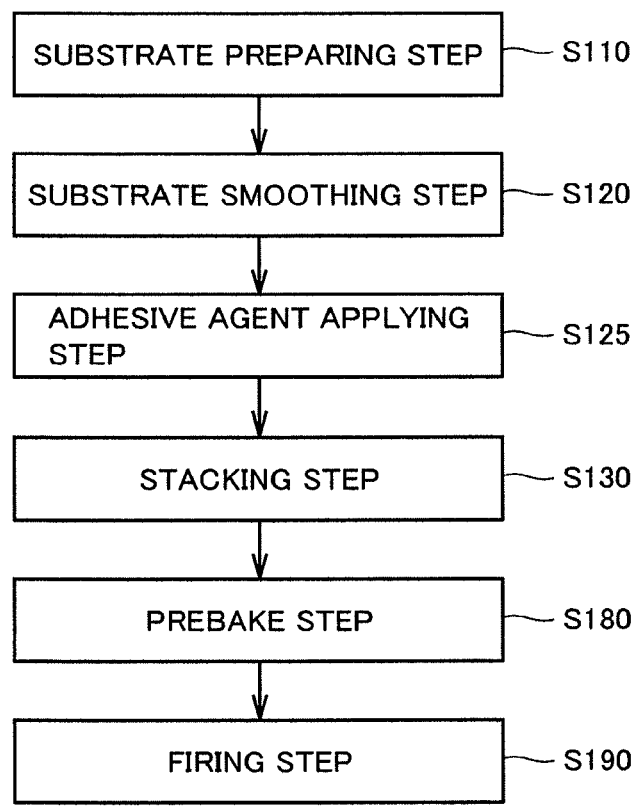
FIG. 25 is a flowchart for schematically illustrating a method for manufacturing the combined substrate shown in FIG. 24.

Referring to FIG. 25, first, step S110 is performed in the same way as in the second embodiment, and then step S120 is performed as required in the same way as in the second embodiment.

Figure 26:
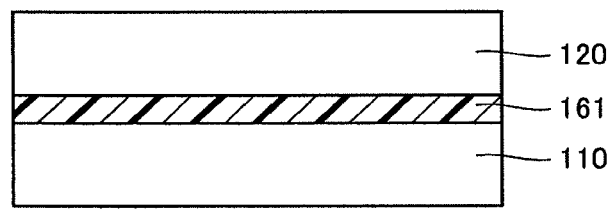
FIG. 26 is a cross sectional view schematically showing one step of the method for manufacturing the combined substrate shown in FIG. 24.

Next, as a step S125, an adhesive agent applying step is performed. In this step S125, as shown in FIG. 26, for example, a carbon adhesive agent is applied to the main surface of base layer 110, thereby forming a precursor layer 161. The carbon adhesive agent can be formed of, for example, a resin, graphite particles, and a solvent. Here, an exemplary resin usable is a resin formed into non-graphitizable carbon by heating, such as a phenol resin. An exemplary solvent usable is phenol, formaldehyde, ethanol, or the like. Further, an amount of application of the carbon adhesive agent is preferably not less than 10 mg/cm$^2$ and not more than 40 mg/cm$^2$, more preferably, not less than 20 mg/cm$^2$ and not more than 30 mg/cm$^2$. Further, the carbon adhesive agent applied preferably has a thickness of not more than 100 μm, more preferably, not more than 50 μm.

Next, the stacking step is performed as a step S130. In this step S130, referring to FIG. 26, substrate 120 is placed on and in contact with precursor layer 161 formed on and in contact with the main surface of base layer 110, thereby fabricating a stacked substrate.

Next, as a step S180, a prebake step is performed. In this step S180, the stacked substrate is heated, thereby removing the solvent component from the carbon adhesive agent constituting precursor layer 161. Specifically, for example, while applying a load to the stacked substrate in the thickness direction thereof, the stacked substrate is gradually heated to fall within a range of temperature exceeding the boiling point of the solvent component. Preferably, this heating is performed with base layer 110 and substrate 120 being pressed against each other using a clamp or the like. Further, by performing the prebaking (heating) as long as possible, the adhesive agent is degassed to improve strength in adhesion.

Next, as a step S190, a firing step is performed. In this step S190, the stacked substrate with precursor layer 161 heated and accordingly prebaked in step S180 is heated to a high temperature, preferably, not less than 900° C. and not more than 1100° C., for example, 1000° C. for preferably not less than 10 minutes and not more than 10 hours, for example, for 1 hour, thereby firing precursor layer 161. Atmosphere employed upon the firing can be an inert gas atmosphere such as argon. The pressure of the atmosphere can be, for example, atmospheric pressure. In this way, precursor layer 161 is formed into carbon layer 160 made of carbon. In this way, combined substrate 2Xe (FIG. 24) is obtained in which base layer 10 and SiC substrate (SiC layer) 20 are connected to each other by carbon layer 160.

It should be noted that the MOSFET has been illustrated in each of the above-described embodiments, but the semiconductor device of the present invention is not limited to this and may be a semiconductor device in another form, such as an IGBT (insulated Gate Bipolar Transistor).

Further, each of the above-described embodiments has illustrated the configuration in which the gate insulating film is provided, but the configuration of the semiconductor device of the present invention is not limited to such a configuration. For example, the semiconductor device may include the configuration having a Schottky junction.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: semiconductor device; 2, 120: substrate; 2A, 120A: main surface (first surface); 2B, 120B: backside surface (second surface); 2p: processing damage layer; 2Z: ingot; 10: gate electrode; 11: source electrode; 12: drain electrode; 21: buffer layer; 22: breakdown voltage holding layer; 23: p region; 24: n$^+$ region; 25: p$^+$ region; 26: oxide film (insulating film); 27: upper source electrode; 110: base layer; 140: amorphous SiC layer; 150: ohmic contact layer; 160: carbon layer; 161: precursor layer; 181: first heater; 182: second heater.

The invention claimed is:

1. A transistor having a current path, comprising:
a semiconductor layer constituting at least a part of said current path and made of silicon carbide; and
a substrate that has a first surface supporting said semiconductor layer and a second surface opposite to said first surface, that is made of silicon carbide having a 4H type single-crystal structure, and that has a physical property in which a ratio of a peak strength in a wavelength of around 500 nm to a peak strength in a wavelength of around 390 nm is 0.1 or smaller in photoluminescence measurement at the second surface.

2. The transistor according to claim 1, further comprising an insulating film on said semiconductor layer.

3. The transistor according to claim 2, wherein said insulating film is made of an oxide of the material of said semiconductor layer.

4. The transistor according to claim 2, wherein said insulating film is a thermal oxidation film.

5. The transistor according to claim 1, wherein said substrate constitutes a part of said current path.

6. The transistor according to claim 1, wherein said first surface has an off angle of not less than 50° and not more than 65° relative to a {0001} plane.

7. The transistor according to claim 6, wherein said off angle has an off orientation falling within a range of ±5° or smaller relative to a <11-20> direction.

8. The transistor according to claim 6, wherein said off angle has an off orientation falling within a range of ±5° or smaller relative to a <01-10> direction.

9. The transistor according to claim 8, wherein said first surface has an off angle of not less than −3° and not more than +5° relative to a {03-38} plane in the <01-10> direction.

10. The transistor according to claim 9, wherein said first surface has an off angle of not less than −3° and not more than +5° relative to a (0-33-8) plane in the <01-10> direction.

11. The transistor according to claim 1, further comprising a base layer supporting said substrate and made of silicon carbide.

12. The transistor according to claim 11, wherein said substrate and said base layer comprise different crystals, wherein said substrate has a defect density less than that of said base layer.

* * * * *